(12) United States Patent
Han

(10) Patent No.: US 11,791,259 B2
(45) Date of Patent: Oct. 17, 2023

(54) SEMICONDUCTOR DEVICE AND METHOD FOR MANUFACTURING THE SAME

(71) Applicant: Samsung Electronics Co., Ltd., Suwon-si (KR)

(72) Inventor: Min Chui Han, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 306 days.

(21) Appl. No.: 16/884,447

(22) Filed: May 27, 2020

(65) Prior Publication Data
US 2021/0159164 A1 May 27, 2021

(30) Foreign Application Priority Data

Nov. 22, 2019 (KR) .......................... 10-2019-0150953

(51) Int. Cl.
| | | |
|---|---|---|
| H01L 23/522 | (2006.01) | |
| H01L 23/528 | (2006.01) | |
| H10B 63/00 | (2023.01) | |
| H10N 70/00 | (2023.01) | |

(52) U.S. Cl.
CPC .......... *H01L 23/528* (2013.01); *H10B 63/30* (2023.02); *H10B 63/80* (2023.02); *H10N 70/826* (2023.02); *H10N 70/841* (2023.02)

(58) Field of Classification Search
CPC .......................... H01L 23/5221; H01L 23/528
See application file for complete search history.

(56) References Cited

U.S. PATENT DOCUMENTS

| | | | |
|---|---|---|---|
| 6,875,684 B2 | 4/2005 | Jin et al. | |
| 6,879,015 B2 | 4/2005 | Liang et al. | |
| 9,899,982 B2 | 2/2018 | Tsai et al. | |
| 10,103,058 B2 | 10/2018 | Chandrashekar et al. | |
| 2003/0113997 A1 | 6/2003 | Lai et al. | |
| 2006/0076641 A1 | 4/2006 | Cho et al. | |
| 2010/0015801 A1 | 1/2010 | Choi et al. | |
| 2021/0159164 A1* | 5/2021 | Han ................... H01L 27/2409 |

FOREIGN PATENT DOCUMENTS

| | | |
|---|---|---|
| JP | H 11251522 A | 9/1999 |
| KR | 10-2014-0141686 A | 12/2014 |
| KR | 101477661 B1 | 12/2014 |

* cited by examiner

*Primary Examiner* — Mark V Prenty
(74) *Attorney, Agent, or Firm* — Harness, Dickey & Pierce, P.L.C.

(57) ABSTRACT

A semiconductor device including a lower layer, a plurality of first interconnection lines extending in a first direction on the lower layer, a plurality of second interconnection lines extending in a second direction intersecting the first direction between the first interconnection lines and connecting the first interconnection lines, the second direction intersecting the first direction, first insulating patterns between the second interconnection lines, and second insulating patterns disposed in the first interconnection lines may be provided. The first interconnection lines include connection regions, to each of which at least one of the second interconnection lines is connected. The second insulating patterns extend into the connection regions.

20 Claims, 14 Drawing Sheets

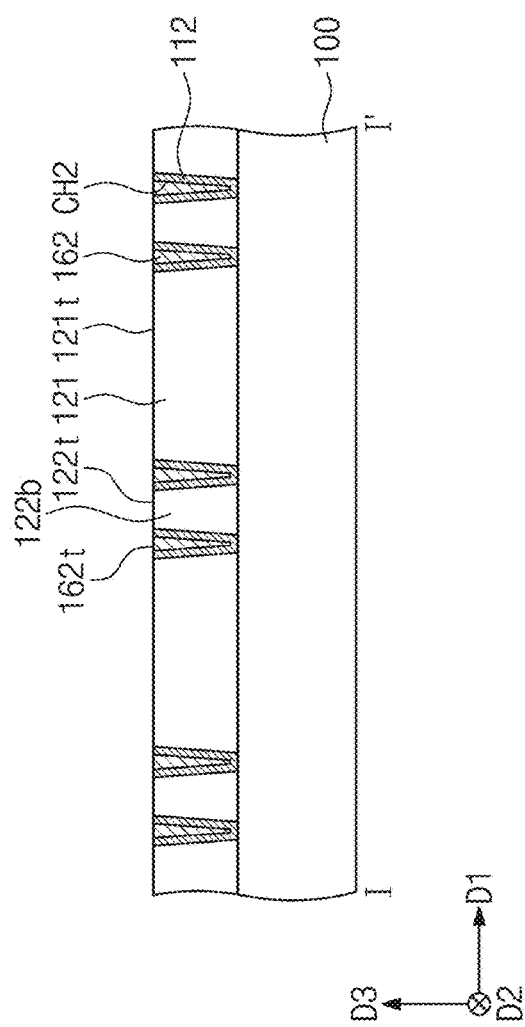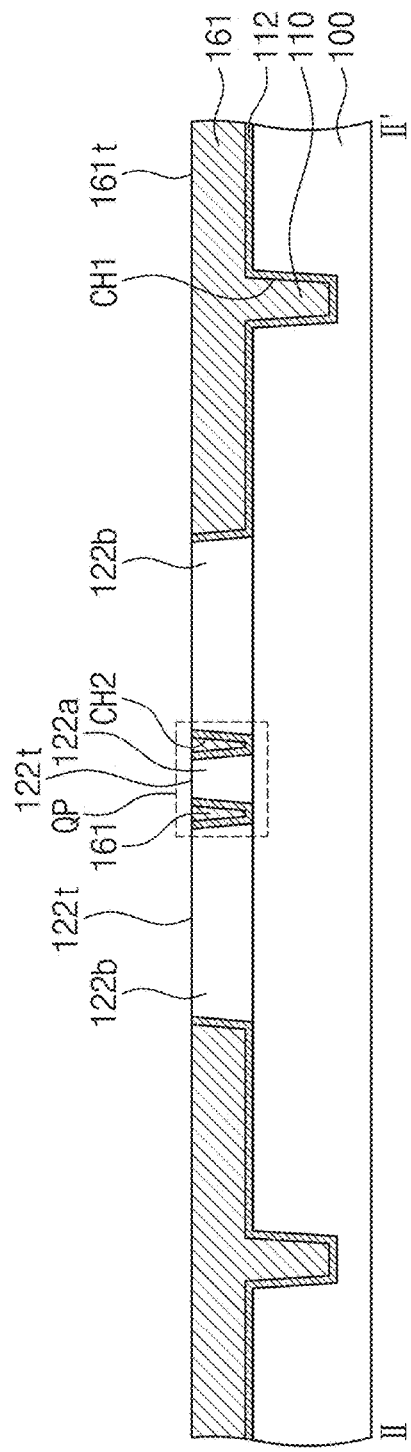

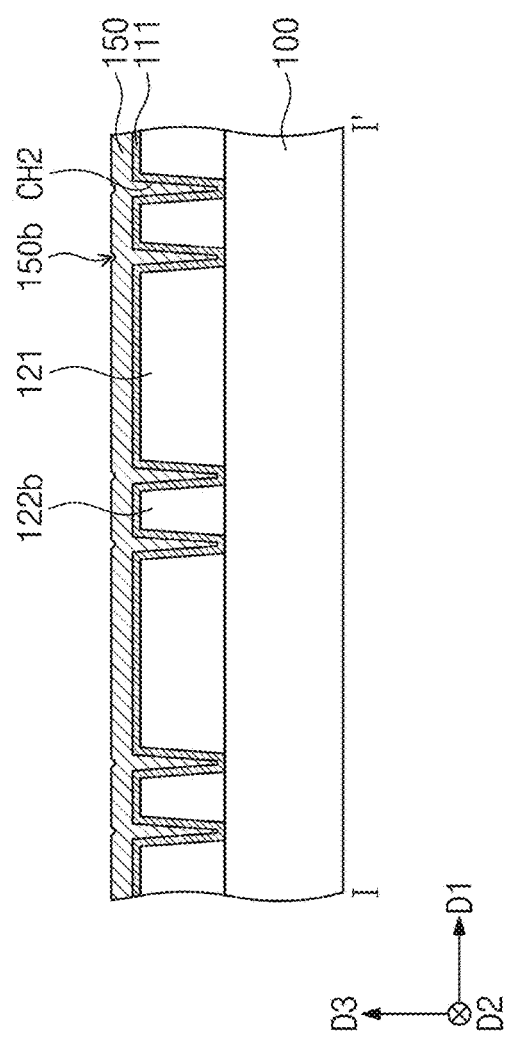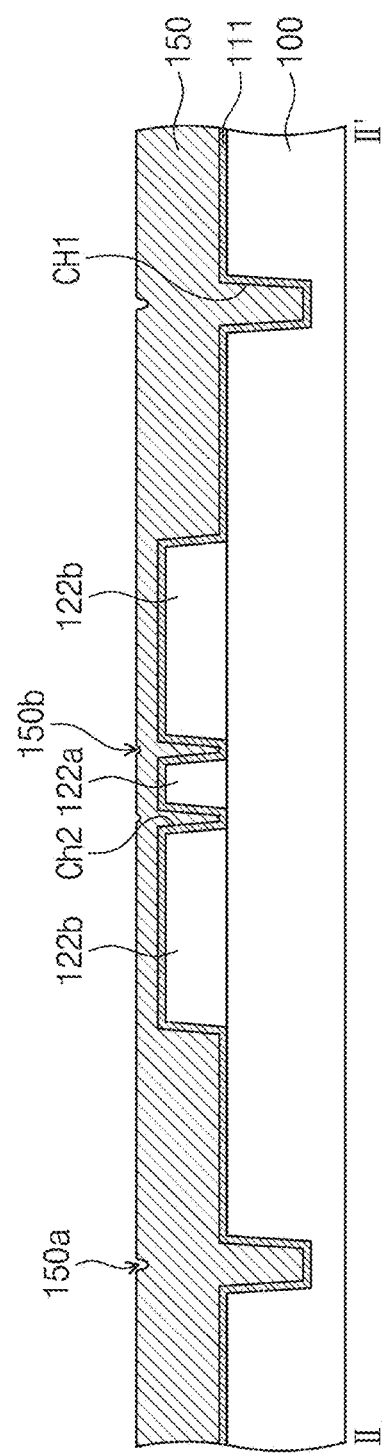

SEMICONDUCTOR DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2019-0150953, filed on Nov. 22, 2019, in the Korean Intellectual Property Office, the disclosure of which is hereby incorporated by reference in its entirety.

BACKGROUND

Some example embodiments of the inventive concepts relate to semiconductor devices and/or methods for manufacturing the same, and more particularly, to semiconductor devices including an interconnection structure which includes a mesh structure and has improved electrical characteristics, and/or methods for manufacturing the same.

Semiconductor devices are widely used in an electronic industry because of their small sizes, multi-functional characteristics, and/or low manufacturing costs. As semiconductor devices become highly integrated with the development of the electronic industry, widths of patterns included in semiconductor devices have been reduced to increase the integration density of semiconductor devices. However, because new exposure techniques and/or expensive exposure techniques are needed to form fine patterns, it is difficult to highly integrate semiconductor devices. Thus, new integration techniques are being studied.

SUMMARY

Some example embodiments of the inventive concepts may provide semiconductor devices including an interconnection structure which includes a mesh structure and has improved electrical characteristics, and/or methods for manufacturing the same.

According to an example embodiment, a semiconductor device may include a lower layer, a plurality of first interconnection lines extending in a first direction on the lower layer, a plurality of second interconnection lines extending in a second direction intersecting the first direction between the first interconnection lines and connecting the first interconnection lines, the second direction intersecting the first direction, first insulating patterns between the second interconnection lines, and second insulating patterns disposed in the first interconnection lines. The first interconnection lines may include connection regions, to each of which at least one of the second interconnection lines is connected. The second insulating patterns may extend into the connection regions.

According to an example embodiment, a semiconductor device may include a lower layer, a plurality of first interconnection lines extending in a first direction on the lower layer, a plurality of second interconnection lines extending in a second direction intersecting the first direction between the first interconnection lines and connecting the first interconnection lines, the second direction intersecting the first direction, first insulating patterns between the second interconnection lines, and second insulating patterns including first portions disposed in the first interconnection lines. First widths of the second insulating patterns in the second direction may be less than second widths of the first insulating patterns in the second direction.

According to an example embodiment, a semiconductor device may include a substrate including a plurality of active regions, at least one interconnection structure on the substrate, a peripheral circuit between the interconnection structure and the substrate and connected to the interconnection structure through a first contact, and a memory device on the interconnection structure and connected to the interconnection structure through a second contact. The peripheral circuit may include transistors formed on the substrate. The memory device may include a plurality of conductive lines and a variable resistance element between the conductive lines. The interconnection structure may include a plurality of first interconnection lines extending in a first direction, a plurality of second interconnection lines extending in a second direction intersecting the first direction between the first interconnection lines and connecting the first interconnection lines, the second direction intersecting the first direction, first insulating patterns between the second interconnection lines, second insulating patterns disposed in the first interconnection lines and the second interconnection lines, and a barrier pattern covering bottom surfaces and sidewalls of the first and second interconnection lines.

BRIEF DESCRIPTION OF THE DRAWINGS

The inventive concepts will become more apparent in view of the attached drawings and accompanying detailed description.

FIGS. 2A and 2B are cross-sectional views taken along lines I-I' and II-II' of FIG. 1, respectively, to illustrate an interconnection structure of a semiconductor device according to an example embodiment of the inventive concepts.

FIGS. 3A to 6A are cross-sectional views taken along the line I-I' of FIG. 1 to illustrate a method for manufacturing an interconnection structure of a semiconductor device, according to an example embodiment of the inventive concepts.

FIGS. 3B to 6B are cross-sectional views taken along the line II-II' of FIG. 1 to illustrate a method for manufacturing an interconnection structure of a semiconductor device, according to an example embodiment of the inventive concepts.

DETAILED DESCRIPTION

A semiconductor device and a method for manufacturing the same according to an example embodiment of the inventive concepts will be described more fully hereinafter with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Figure 1:
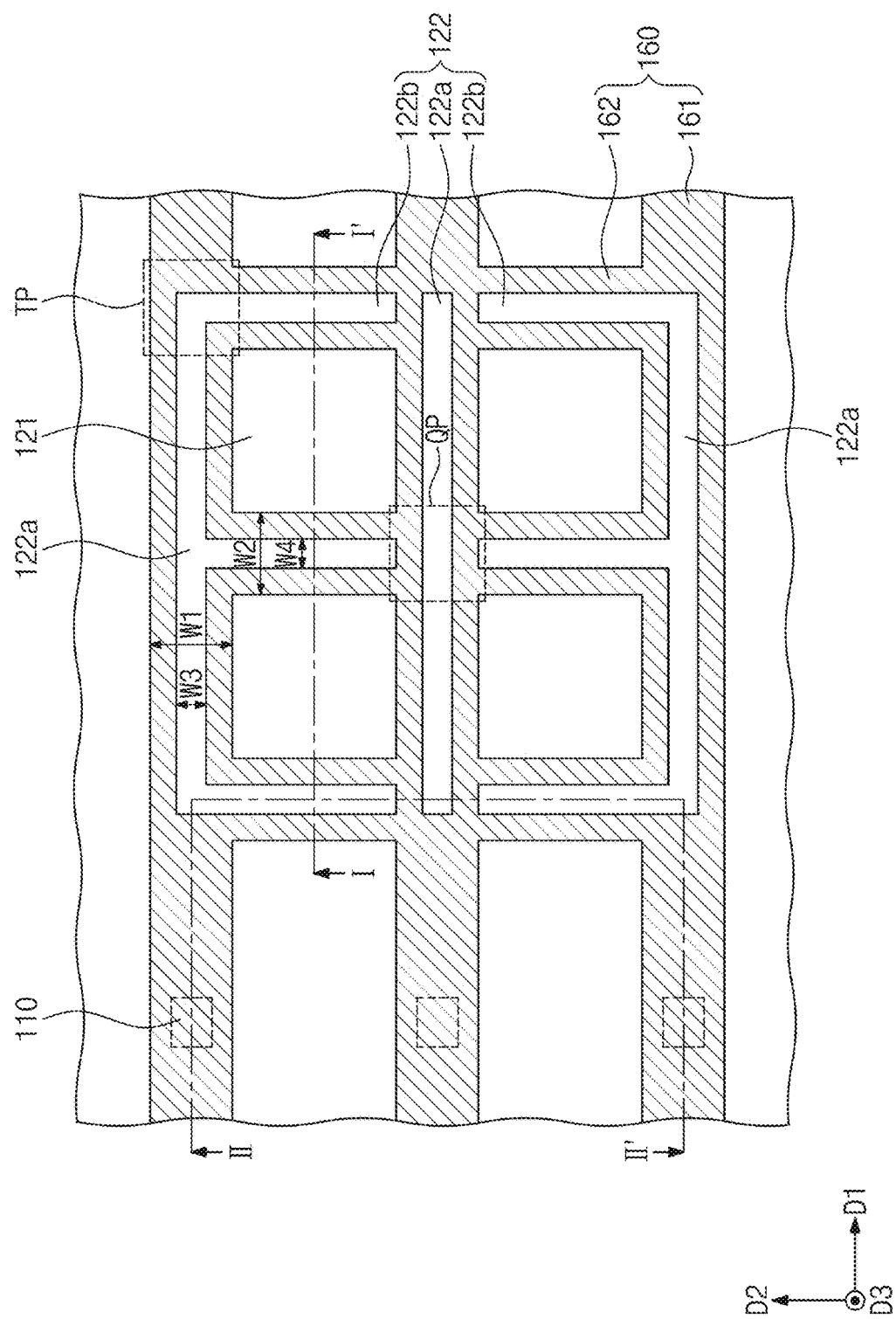
FIG. 1 is a plan view illustrating an interconnection structure of a semiconductor device according to an example embodiment of the inventive concepts.

FIG. 1 is a plan view illustrating an interconnection structure of a semiconductor device according to an example embodiment of the inventive concepts. FIGS. 2A and 2B are cross-sectional views taken along lines I-I' and II-II' of FIG. 1, respectively, to illustrate an interconnection structure of a semiconductor device according to an example embodiment of the inventive concepts.

Referring to FIGS. 1, 2A and 2B, a lower layer 100 including contacts 110 may be provided. The contacts 110 may include a conductive material. For example, the contacts 110 may include at least one of tungsten (W), copper (Cu), or aluminum (Al). The lower layer 100 may include a semiconductor substrate, semiconductor components (e.g., a MOS transistor, a capacitor, and a resistor) formed on the semiconductor substrate, and at least one or more insulating layers covering the semiconductor components. Here, the semiconductor components may be electrically connected to the contacts 110. Each of the insulating layers may include a silicon oxide layer, or a low-k dielectric layer of which a dielectric constant is lower than that of the silicon oxide layer. In an example embodiment, the insulating layers may be inter-metal dielectric (IMD) layers. A barrier pattern 112 may be provided between the lower layer 100 and the contacts 110. The barrier pattern 112 may mitigate or prevent material-diffusion between the lower layer 100 and the contacts 110. For example, the barrier pattern 112 may include at least one of Ta, TaN, TaSiN, Ti, TiN, TiSiN, W, or WN. Even though not shown in the drawings, a seed layer may be provided between the barrier pattern 112 and the contacts 110.

An interconnection pattern 160, a first insulating pattern 121 and a second insulating pattern 122 may be provided on the lower layer 100. The barrier pattern 112 may also be provided between the interconnection pattern 160 and the lower layer 100. The barrier pattern 112 may mitigate or prevent material-diffusion between the interconnection pattern 160 and the lower layer 100. Even though not shown in the drawings, the seed layer may also be provided between the barrier pattern 112 and the interconnection pattern 160.

The interconnection pattern 160 may include a plurality of first interconnection lines 161 and a plurality of second interconnection lines 162. The first interconnection lines 161 may extend in a first direction D1 on the lower layer 100. The first direction D1 may be parallel to a top surface of the lower layer 100. The first interconnection lines 161 may be spaced apart from each other in a second direction D2. The second direction D2 may be parallel to the top surface of the lower layer 100, and may be perpendicular to the first direction D1. Top surfaces 161t of the first interconnection lines 161 may be flat without a dent.

The second interconnection lines 162 may extend in the second direction D2 on the lower layer 100. For example, the second interconnection lines 162 may extend from one of the first interconnection lines 161 in the second direction D2 or a direction opposite to the second direction D2. The second interconnection lines 162 may be spaced apart from each other in the first direction D1. Top surfaces 162t of the second interconnection lines 162 may be flat without a dent. The top surfaces 162t of the second interconnection lines 162 may be coplanar with the top surfaces 161t of the first interconnection lines 161. Further, for example, a first width W1 of each of the first interconnection lines 161 in the second direction D2 may be equal to or substantially equal to a second width W2 of each of the second interconnection lines 162 in the first direction D1. The first width W1 may be the maximum width in the second direction D2 at the top surface 161t of the first interconnection line 161. The second width W2 may be the maximum width in the first direction D1 at the top surface 162t of the second interconnection line 162. For example, each of the first and second widths W1 and W2 may range from about 200 nm to about 500 nm. For example, each of the first and second widths W1 and W2 may range from about 300 nm to about 400 nm.

The top surface 161t and 162t of the interconnection pattern 160 may be flat without a dent. Thus, when additional interconnection lines and an additional insulating pattern are deposited or formed on the interconnection pattern 160, top surfaces of the additional interconnection lines and a top surface of the additional insulating pattern also may be formed to be flat without a dent. Therefore, it is possible to mitigate or prevent a metal material from remaining at a level lower than the top surface of the additional insulating pattern. Thus, the metal material may not be disposed in an undesired portion, and thus occurrence of standby fail may be reduced.

The first interconnection lines 161 may be electrically connected to each other through the second interconnection lines 162. The first interconnection lines 161 may be connected to the second interconnection lines 162 at connection regions. The connection regions may include first regions QP and second regions TP.

The first regions QP may be defined as partial regions of the first interconnection lines 161, each of which is connected to the second interconnection lines 162 in the second direction D2 and the direction opposite to the second direction D2. Meanwhile, one of the first interconnection lines 161 may be connected to the second interconnection lines 162 in only one of the second direction D2 or the direction opposite to the second direction D2. For example, the outermost one of the first interconnection lines 161 may be connected to the second interconnection lines 162 in only one direction. The second regions TP may be defined as partial regions of the first interconnection lines 161, each of which is connected to the second interconnection line 162 in one of the second direction D2 or the direction opposite to the second direction D2.

The first interconnection lines 161 spaced apart from each other in the second direction D2 may be connected to the second interconnection lines 162 spaced apart from each other in the first direction D1, thereby forming the interconnection pattern 160 having a mesh shape. The interconnection pattern 160 may overlap with the contacts 110 in a third direction D3. In other words, the interconnection pattern 160 may be electrically connected to the contacts 110. The third direction D3 may be perpendicular to the top surface of the lower layer 100. The third direction D3 may be perpendicular to both the first direction D1 and the second direction D2. For example, the first interconnection lines 161 may overlap with the contacts 110 in the third direction D3. Although not illustrated in FIGS. 1, 2A and 2B, the second interconnection lines 162 may overlap with the contacts 110 in the third direction D3. The interconnection pattern 160 may include a conductive material. For example, the interconnection pattern 160 may include at least one of tungsten (W), copper (Cu), or aluminum (Al). For example, the interconnection pattern 160 may include tungsten (W). The interconnection pattern 160 may include the same or substantially similar material as the contacts 110. A sidewall of the interconnection pattern 160 may have a gradient with respect to the top surface of the lower layer 100. An area of a cross section, at a level perpendicular to the third direction D3, of the interconnection pattern 160 may increase as a height in the third direction D3 increases.

The first insulating pattern 121 may surround the first and second interconnection lines 161 and 162 on the lower layer 100 when viewed in a plan view. The first insulating pattern 121 may be provided in an open space of the mesh shape of the interconnection pattern 160. For example, the first insulating pattern 121 may include an insulating material such as silicon oxide, silicon nitride, silicon oxynitride, or a low-k dielectric material. For example, the first insulating pattern 121 may include silicon oxide. The barrier pattern 112 may be disposed between the first insulating pattern 121 and the interconnection pattern 160. A top surface 121t of the first insulating pattern 121 may be coplanar with the top surfaces 161t of the first interconnection lines 161 and the top surfaces 162t of the second interconnection lines 162. In FIG. 1, a width of the first insulating pattern 121 in the second direction D2 is greater than the first width W1 of the first interconnection line 161 in the second direction D2. However, example embodiments of the inventive concepts are not limited thereto. In certain example embodiments, the width of the first insulating pattern 121 in the second direction D2 may be less than the first width W1 of the first interconnection line 161 in the second direction D2.

The second insulating pattern 122 may be disposed in the interconnection pattern 160. The second insulating pattern 122 may be spaced apart from the first insulating pattern 121 with the interconnection pattern 160 interposed therebetween. In an example embodiment, the second insulating pattern 122 may include a plurality of first portions 122a and a plurality of second portions 122b. The first portions 122a may be disposed in the first interconnection lines 161 and may extend in the first direction D1. Further, the first portions 122a may be spaced apart from the first insulating pattern 121 with the first interconnection lines 161 interposed therebetween. The second portions 122b may be disposed in the second interconnection lines 162 and may extend in the second direction D2. Further, the second portions 122b may be spaced apart from the first insulating pattern 121 with the second interconnection lines 162 interposed therebetween. The second portions 122b may extend in the second direction D2 between the first portions 122a. For example, an extending length of each of the second portions 122b in the second direction D2 may be equal to or greater than a distance between the first interconnection lines 161. The second insulating pattern 122 including the first portions 122a and the second portions 122b may have a mesh shape of which at least a portion is cut. A third width W3 of each of the first portions 122a in the second direction D2 may be less than the first width W1 of each of the first interconnection lines 161 in the second direction D2. A fourth width W4 of each of the second portions 122b in the first direction D1 may be less than the second width W2 of each of the second interconnection lines 162 in the first direction D1. For example, the third width W3 of each of the first portions 122a in the second direction D2 may be equal to or substantially equal to the fourth width W4 of each of the second portions 122b in the first direction D1. For example, each of the third and fourth widths W3 and W4 may range from about 60 nm to about 250 nm. For example, each of the third and fourth widths W3 and W4 may range from about 100 nm to about 210 nm. Further, each of a ratio of the third width W3 to the first width W1 and a ratio of the fourth width W4 to the second width W2 may range from about 30% to about 60%. The second insulating pattern 122 may include the same or substantially similar material as the first insulating pattern 121. For example, the second insulating pattern 122 may include silicon oxide. In such case, bottom surfaces of the first and second insulating patterns 121 and 122 may be substantially coplanar with the top surface of the lower layer 100.

Due to the second insulating pattern 122 disposed in the interconnection pattern 160, the top surface 161t and 162t of the interconnection pattern 160 may be formed to be flat at the first regions QP and the second regions TP of the interconnection pattern 160. For example, the second insulating pattern 122 may extend into centers of the first regions QP and centers of the second regions TP, and thus the maximum width (e.g., a width in a diagonal direction) of the interconnection pattern 160 provided at the first and second regions QP and TP may be reduced and a dent may not remain after a planarization process.

Sidewalls of the first portions 122a may be covered by the first interconnection lines 161. The barrier pattern 112 may be disposed between the first portions 122a and the first interconnection lines 161. Top surfaces 122t of the first portions 122a may be coplanar with the top surfaces 161t of the first interconnection lines 161. Each of the first portions 122a may extend into the centers of the first regions QP or the centers of the second regions TP. The first portions 122a may be spaced apart from each other in the second direction D2. Unlike FIG. 1, each of the first portions 122a may include a plurality of sub-portions extending in the first direction D1. In such case, the plurality of sub-portions extending in the first direction D1 may be spaced apart from each other in the first direction D1.

Sidewalls of the second portions 122b may be covered by the second interconnection lines 162. The barrier pattern 112 may be disposed between the second portions 122b and the second interconnection lines 162. Top surfaces 122t of the second portions 122b may be coplanar with the top surfaces 162t of the second interconnection lines 162. The second portions 122b may be spaced apart from each other in the first direction D1. Each of the second portions 122b may be connected to one of the first portions 122a adjacent thereto. Further, each of the second portions 122b may be spaced apart from another of the first portions 122a adjacent thereto. A portion of the first interconnection line 161 may be provided between the second portion 122b and the first portion 122a spaced apart from the second portion 122b. Unlike FIG. 1, each of the second portions 122b may include a plurality of sub-portions extending in the second direction D2. In such case, the plurality of sub-portions extending in the second direction D2 may be spaced apart from each other in the second direction D2.

Sidewalls of the first and second insulating patterns 121 and 122 may have gradients with respect to the top surface of the lower layer 100. An area of a cross section, at a level perpendicular to the third direction D3, of each of the first and second insulating patterns 121 and 122 may decrease as a height in the third direction D3 increases.

Although not shown in the drawings, an additional insulating pattern including a capping pattern and/or additional interconnection lines may further be provided on the interconnection pattern 160. The capping pattern may mitigate or prevent a metal material of the interconnection pattern 160 from being damaged and lost. The interconnection pattern 160 may be electrically connected to the additional interconnection lines.

FIGS. 3A to 6A are cross-sectional views taken along the line I-I' of FIG. 1 to illustrate a method for manufacturing an interconnection structure of a semiconductor device, according to an example embodiment of the inventive concepts. FIGS. 3B to 6B are cross-sectional views taken along the line II-II' of FIG. 1 to illustrate a method for manufacturing an interconnection structure of a semiconductor device, according to an example embodiment of the inventive concepts.

Hereinafter, a method for manufacturing an interconnection structure of a semiconductor device according to an example embodiment of the inventive concepts will be described with reference to FIGS. 3A to 6A, 3B to 6B, as well as FIGS. 1, 2A and 2B.

Figure 3A:
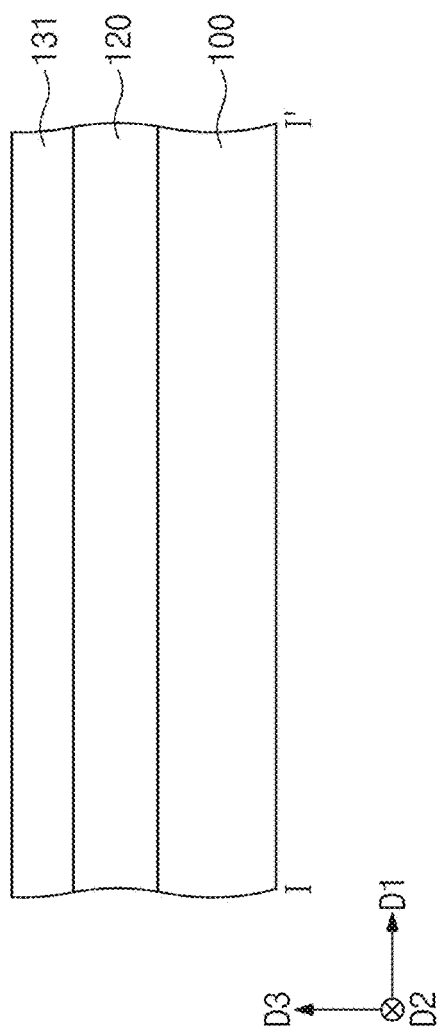
Figure 3B:
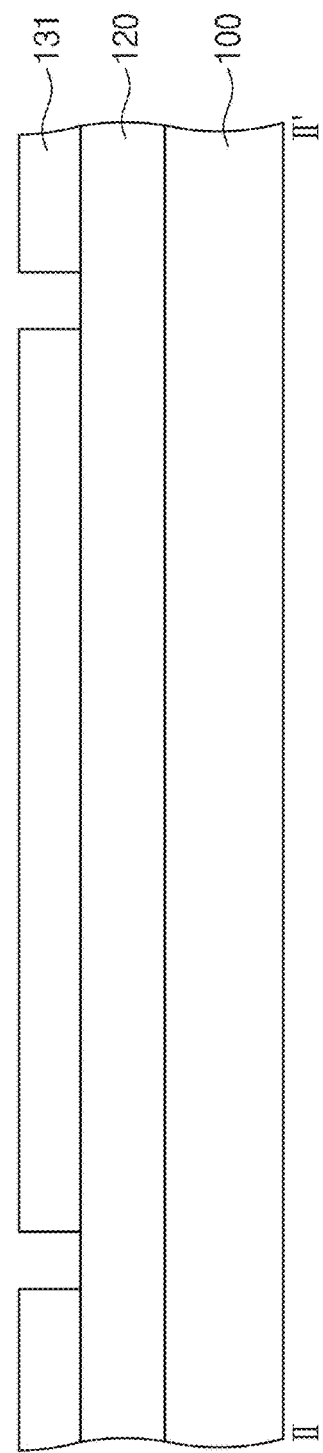

Referring to FIGS. 3A and 3B, an insulating layer 120 may be formed on a lower layer 100. The insulating layer 120 may entirely cover a top surface of the lower layer 100. A first photoresist pattern 131 may be formed on a portion of the insulating layer 120. Thereafter, the insulating layer 120 may be patterned using the first photoresist pattern 131. The patterning of the insulating layer 120 may be performed by an etching process using the first photoresist pattern 131 as an etch mask.

Figure 4A:
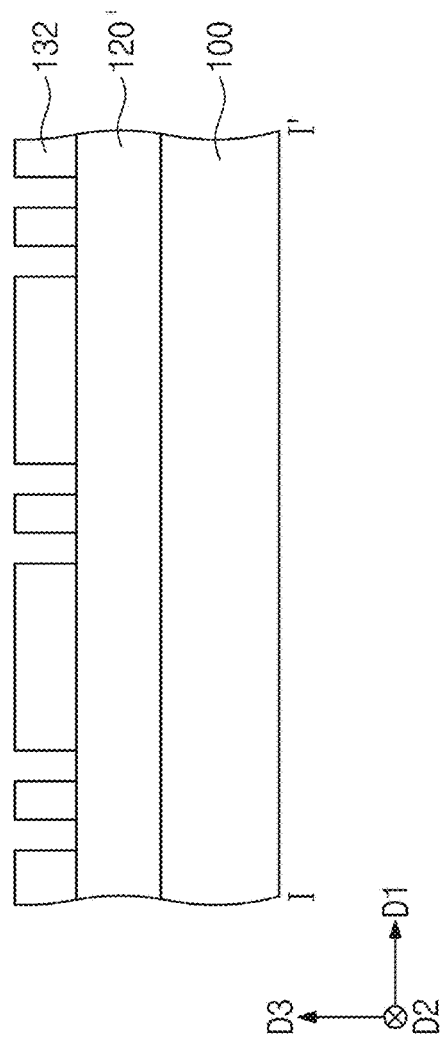
Figure 4B:
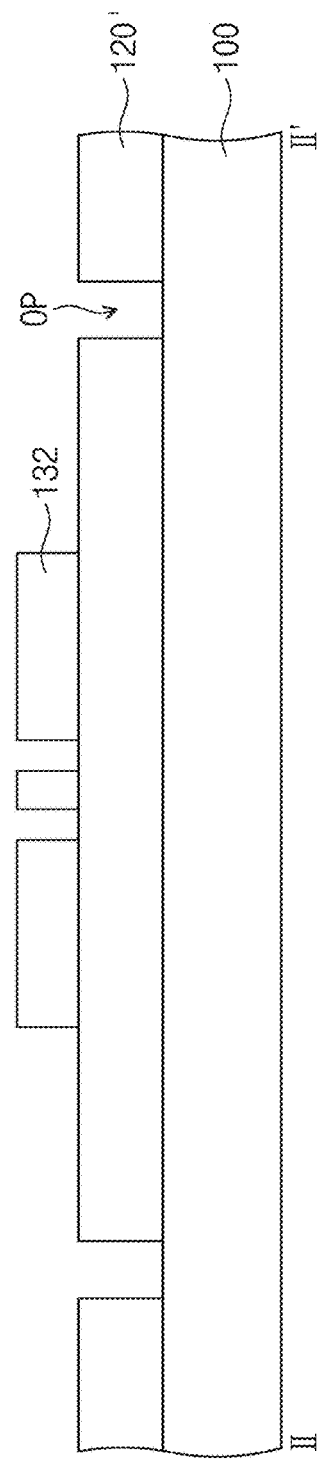

Referring to FIGS. 4A and 4B, a second photoresist pattern 132 may be formed on the patterned insulating layer 120'. Thereafter, the patterned insulating layer 120' may be patterned again using the second photoresist pattern 132. Further, portions of the lower layer 100, which are exposed by openings OP of the patterned insulating layer 120', may be etched. The patterning of the patterned insulating layer 120' and the etching of the portions of the lower layer 100 may be performed by an etching process.

Figure 5A:
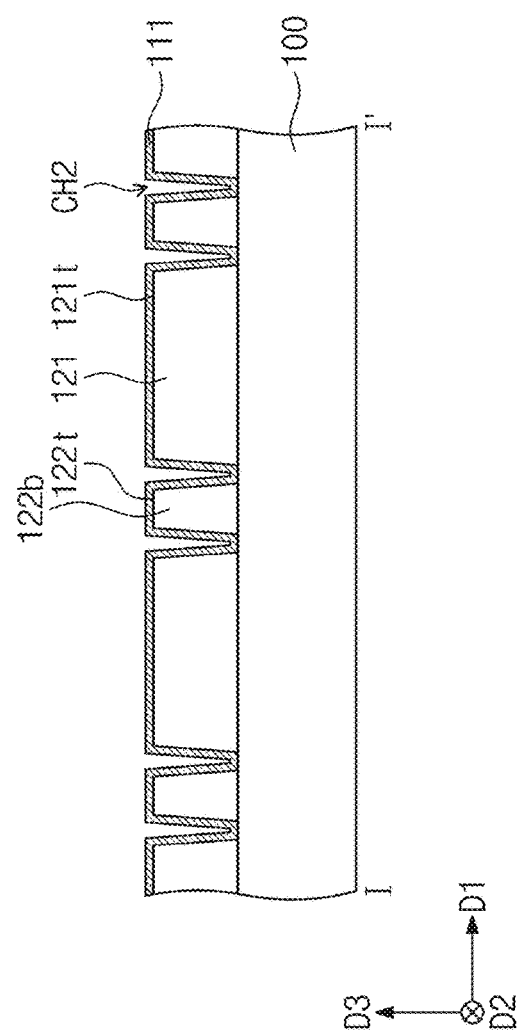
Figure 5B:
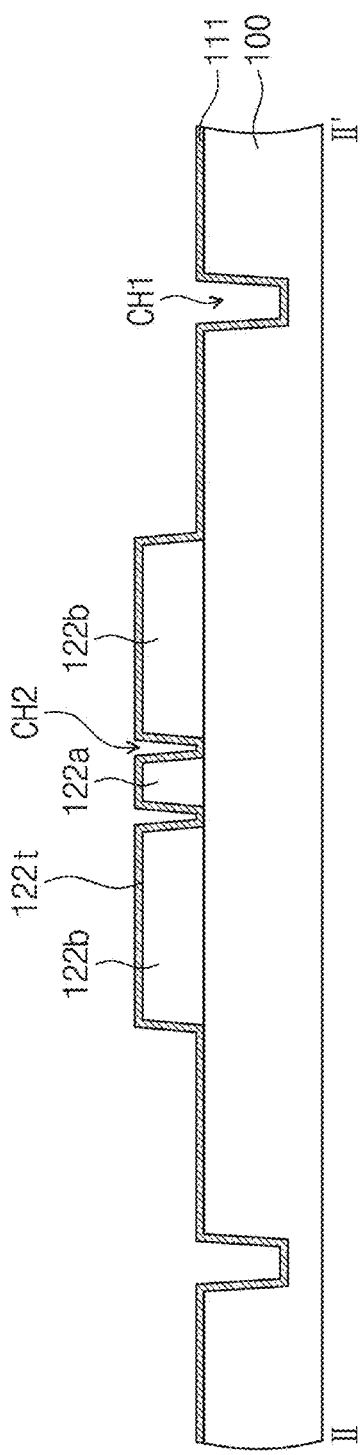

Referring to FIGS. 5A and 5B, a first insulating pattern 121 and a second insulating pattern 122 may be formed by the etching of the patterned insulating layer 120'. The second insulating pattern 122 may include a plurality of first portions 122a extending in the first direction D1 and a plurality of second portions 122b extending in the second direction D2. A plurality of first contact holes CH1 may be formed by the etching of the portions of the lower layer 100. A plurality of second contact holes CH2 may be formed by the etching of the patterned insulating layer 120'. A barrier layer 111 may be conformally formed on a top surface 121t of the first insulating pattern 121, a top surface 122t of the second insulating pattern 122, and a portion of the top surface of the lower layer 100 exposed to the outside by the etching of the portions of the lower layer 100 and the patterned insulating layer 120'. Further, the barrier layer 111 may conformally cover sidewalls of the first insulating pattern 121, sidewalls of the second insulating pattern 122, inner surfaces of the first contact holes CH1, and inner surfaces of the second contact holes CH2. The barrier layer 111 may be formed using a chemical vapor deposition (CVD) method, an atomic layer deposition (ALD) method, or a physical vapor deposition (PVD) method (e.g., a sputtering method).

Referring to FIGS. 6A and 6B, a metal layer 150 may be formed on the barrier layer 111. The metal layer 150 may fill the first contact holes CH1 and the second contact holes CH2. For example, the metal layer 150 may be formed using a CVD method, an ALD method, a PVD method (e.g., a sputtering method), an electro plating method, or an electroless plating method. Although not shown in the drawings, a seed layer may be formed on the barrier layer 111 before the formation of the metal layer 150. The seed layer may increase uniformity of the metal layer 150 and may provide initial nucleation sites. The seed layer may be formed of a material selected depending on a material of the metal layer 150.

A top surface of the metal layer 150 may be located at a higher level than the top surfaces 121t and 122t of the first and second insulating patterns 121 and 122. A first dent 150a and a second dent 150b may be formed at the top surface of the metal layer 150. The first dent 150a may be formed at a position overlapping with the first contact hole CH1 in the third direction D3. The second dent 150b may be formed at a position overlapping with the second contact hole CH2 in the third direction D3. Heights from the top surface of the lower layer 100 to the first and second dents 150a and 150b may be greater than heights from the top surface of the lower layer 100 to the top surface 121t or 122t of the first or second insulating pattern 121 or 122.

Referring again to FIGS. 1, 2A and 2B, a portion of the metal layer 150 of FIGS. 6A and 6B and a portion of the barrier layer 111 of FIGS. 6A and 6B may be removed by a planarization process. The planarization process may be performed to expose the top surfaces 121t and 122t of the first and second insulating patterns 121 and 122. Further, a barrier pattern 112, first interconnection lines 161 and second interconnection lines 162 may be formed by performing the planarization process. For example, a chemical mechanical polishing (CMP) process may be used as the planarization process. The CMP process may be a technique of physically planarizing a target surface by relative rotation of the target surface and a polishing pad while chemically reacting the target surface with slurry (a polishing solution) supplied to the target surface in a state where the target surface is in contact with a surface of the polishing pad. The top surfaces 121t and 122t of the first and second insulating patterns 121 and 122, top surfaces 161t of the first interconnection lines 161 and top surfaces 162t of the second interconnection lines 162 may be flat after the planarization process is performed. The top surfaces 121t and 122t of the first and second insulating patterns 121 and 122 may be coplanar with a top surface of the barrier pattern 112, the top surfaces 161t of the first interconnection lines 161 and the top surfaces 162t of the second interconnection lines 162.

As described above, in the method for manufacturing a semiconductor device according to the example embodiments of the inventive concepts, the interconnection structure may be manufactured using a damascene process. As described in the method for manufacturing the interconnection structure of the semiconductor device according to the example embodiments of the inventive concepts, the damascene process may be a technique which includes forming a trench by patterning an insulating layer, filling the trench with a conductive material (e.g., tungsten (W), aluminum (Al) or copper (Cu)), and removing a portion of the conductive material to leave a desired interconnection line by an etch-back process or a CMP process. In the damascene process, the interconnection line may be formed in a shape of the trench. FIGS. 3A to 6A, 3B to 6B, 1, 2A and 2B illustrate a dual damascene process of forming the interconnection pattern 160 and the contacts 110 at the same time. However, example embodiments of the inventive concepts are not limited thereto. The semiconductor device including the interconnection pattern 160 of the mesh shape and the second insulating pattern 122 disposed in the interconnection pattern 160 may be manufactured using at least one of different methods.

Figure 7:
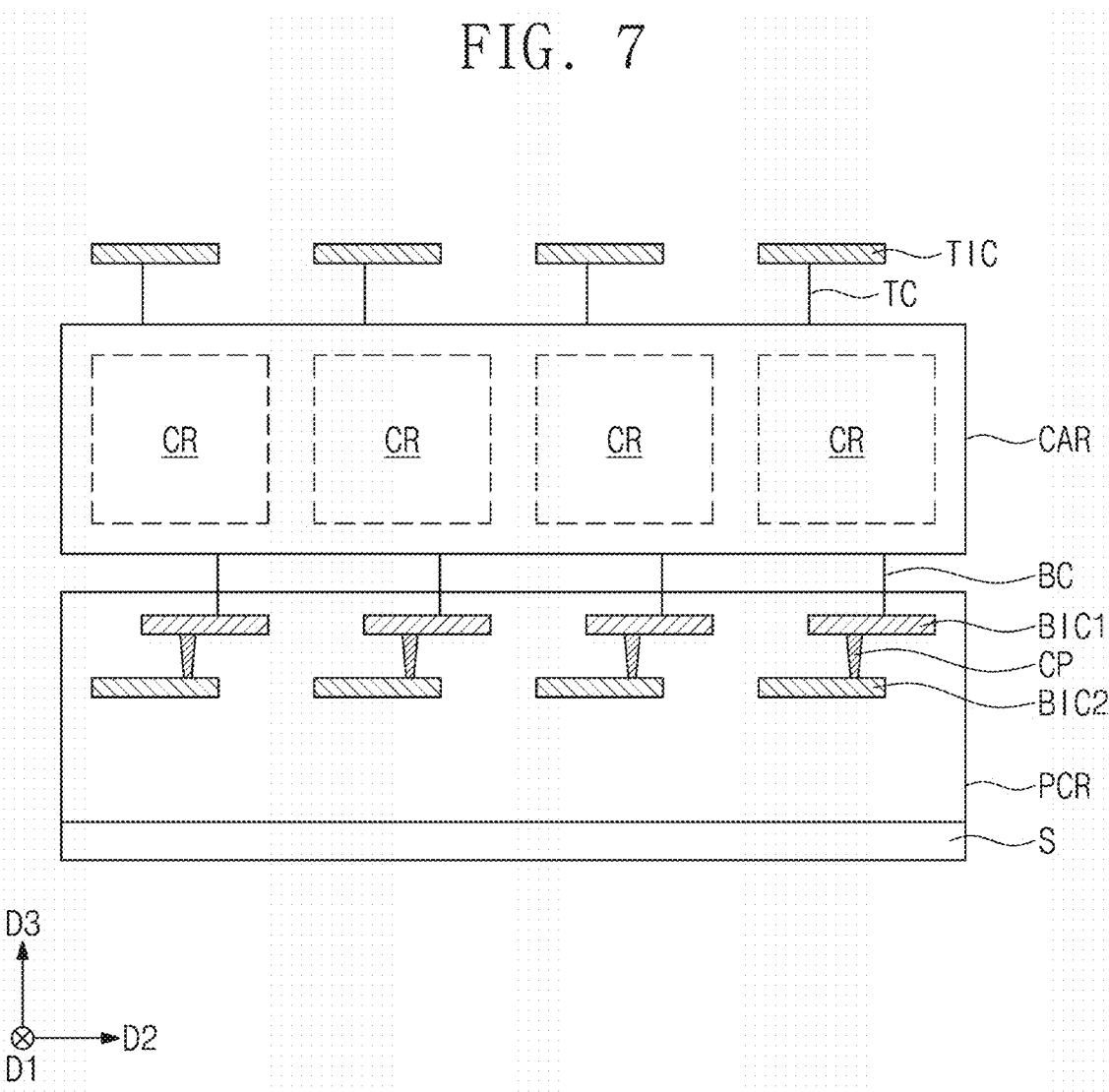
FIG. 7 is a conceptual view illustrating a semiconductor device according to an example embodiment of the inventive concepts.

FIG. 7 is a conceptual view illustrating a semiconductor device according to an example embodiment of the inventive concepts.

Referring to FIG. 7, a semiconductor device may include a substrate S, a cell array region CAR including a plurality of cell regions CR, and a peripheral circuit region PCR overlapping the cell array region CAR in the third direction D3. The cell regions CR of the semiconductor device may include selection elements and/or data storage elements. For example, the selection element may be a MOS transistor or a diode. The data storage element may be a capacitor or a variable resistor. The peripheral circuit region PCR may be formed on the substrate S. The peripheral circuit region PCR may include peripheral circuits for controlling the cell regions CR. For example, the peripheral circuits may include an NMOS transistor, a PMOS transistor, a diode, and a resistor. The peripheral circuit region PCR may be provided under the cell array region CAR, and thus an additional area for the peripheral circuit region PCR may not be needed. In other words, since the peripheral circuit region PCR overlaps the cell array region CAR in the third direction D3, the semiconductor device may be highly integrated.

The semiconductor device may further include an upper interconnection structure TIC, an upper contact TC connecting the cell array region CAR to the upper interconnection structure TIC, first and second lower interconnection structures BIC1 and BIC2 disposed in the peripheral circuit region PCR, a lower contact BC connecting the cell array region CAR to the first lower interconnection structure BIC1, and a contact plug CP connecting the first and second lower interconnection structures BIC1 and BIC2 to each other. Here, each of the upper interconnection structure TIC and the first and second lower interconnection structures BIC1 and BIC2 may have the structure described with reference to FIGS. 1, 2A and 2B. In other words, each of the upper interconnection structure TIC and the first and second lower interconnection structures BIC1 and BIC2 may include the first interconnection lines extending in the first direction D1, and the second interconnection lines extending in the second direction D2 and connecting the first interconnection lines. That is, each of the upper interconnection structure TIC and the first and second lower interconnection structures BIC1 and BIC2 may have the mesh shape. An electrical resistance between the cell array region CAR and the peripheral circuit region PCR of the semiconductor device may be reduced by the interconnection structures BIC1, BIC2 and TIC having the mesh shapes. Further, each of the interconnection structures BIC1, BIC2 and TIC may be formed without a seam or a void, and thus electrical characteristics of the semiconductor device may be improved.

FIGS. 8 to 12 are plan views illustrating interconnection structures of semiconductor devices according to some example embodiments of the inventive concepts. Hereinafter, the descriptions of the same or substantially similar features and components as those of the example embodiment of FIG. 1 will be omitted for the purpose of ease and convenience in explanation.

Figure 8:
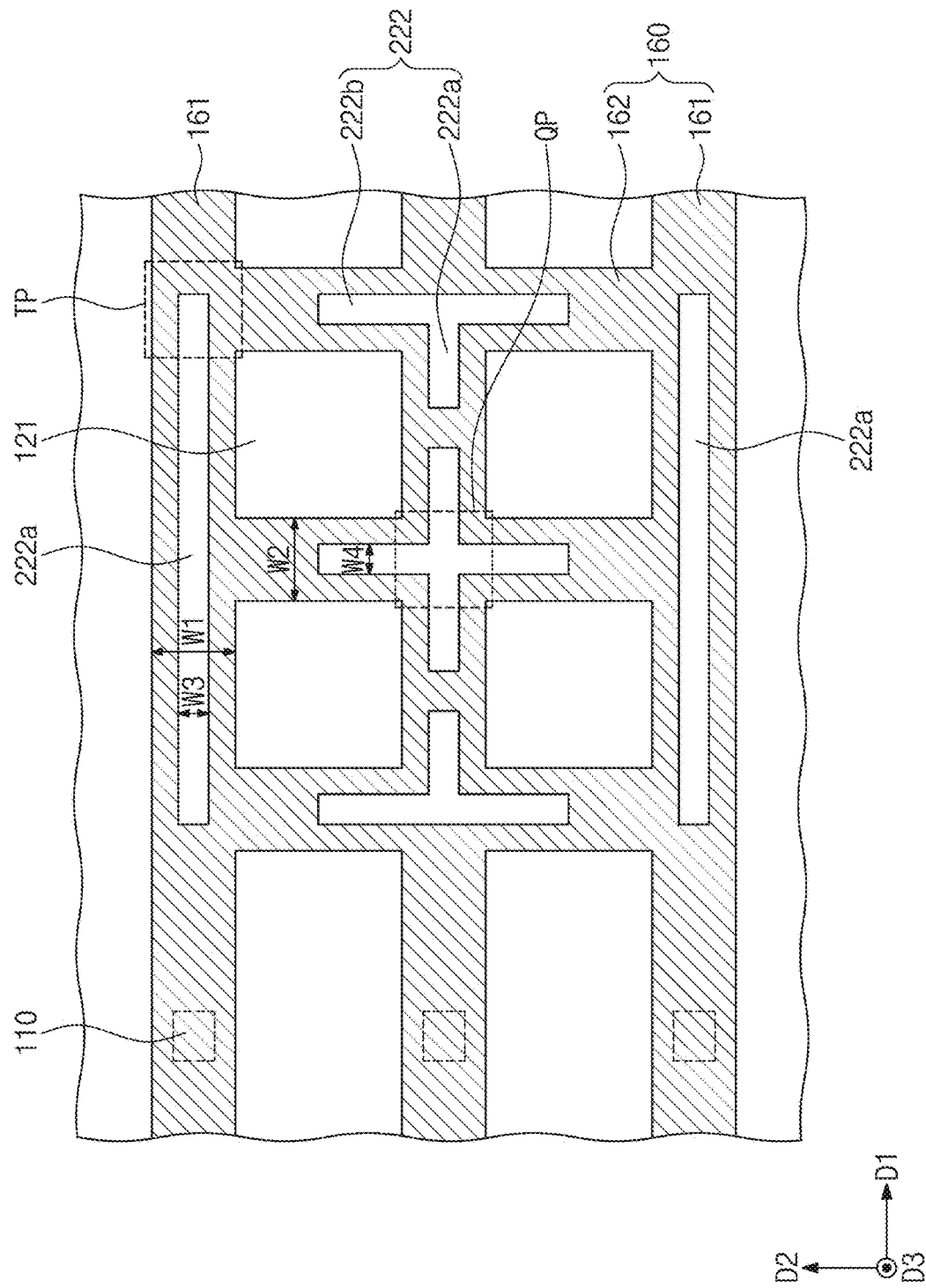
FIGS. 8 to 12 are plan views illustrating interconnection structures of semiconductor devices according to some example embodiments of the inventive concepts.

Referring to FIG. 8, a second insulating pattern 222 may be disposed in the interconnection pattern 160. In an example embodiment, the second insulating pattern 222 may include a plurality of first portions 222a and a plurality of second portions 222b. The first portions 222a may be disposed in the first interconnection lines 161, and may extend in the first direction D1. The second portions 222b may be disposed in the second interconnection lines 162, and may extend in the second direction D2. The second portions 222b may extend in the second direction D2 between the first portions 222a. In other words, the second insulating pattern 222 including the first portions 222a and the second portions 222b may have a mesh shape of which at least a portion is cut.

The first portions 222a may extend into the center of the first region QP or the center of the second region TP. The first portions 222a may be spaced apart from each other in the second direction D2. At least one of the first portions 222a may include a plurality of sub-portions extending in the first direction D1. In such case, the plurality of sub-portions extending in the first direction D1 may be spaced apart from each other in the first direction D1.

The second portions 222b may be spaced apart from each other in the first direction D1. Each of the second portions 222b may be connected to one of the first portions 222a adjacent thereto. Further, each of the second portions 222b may be spaced apart from another of the first portions 222a adjacent thereto. A portion of the first interconnection line 161 may be provided between the second portion 222b and the first portion 222a spaced apart from the second portion 222b. Unlike FIG. 8, each of the second portions 222b may include a plurality of sub-portions extending in the second direction D2. In such case, the plurality of sub-portions extending in the second direction D2 may be spaced apart from each other in the second direction D2.

Figure 9:
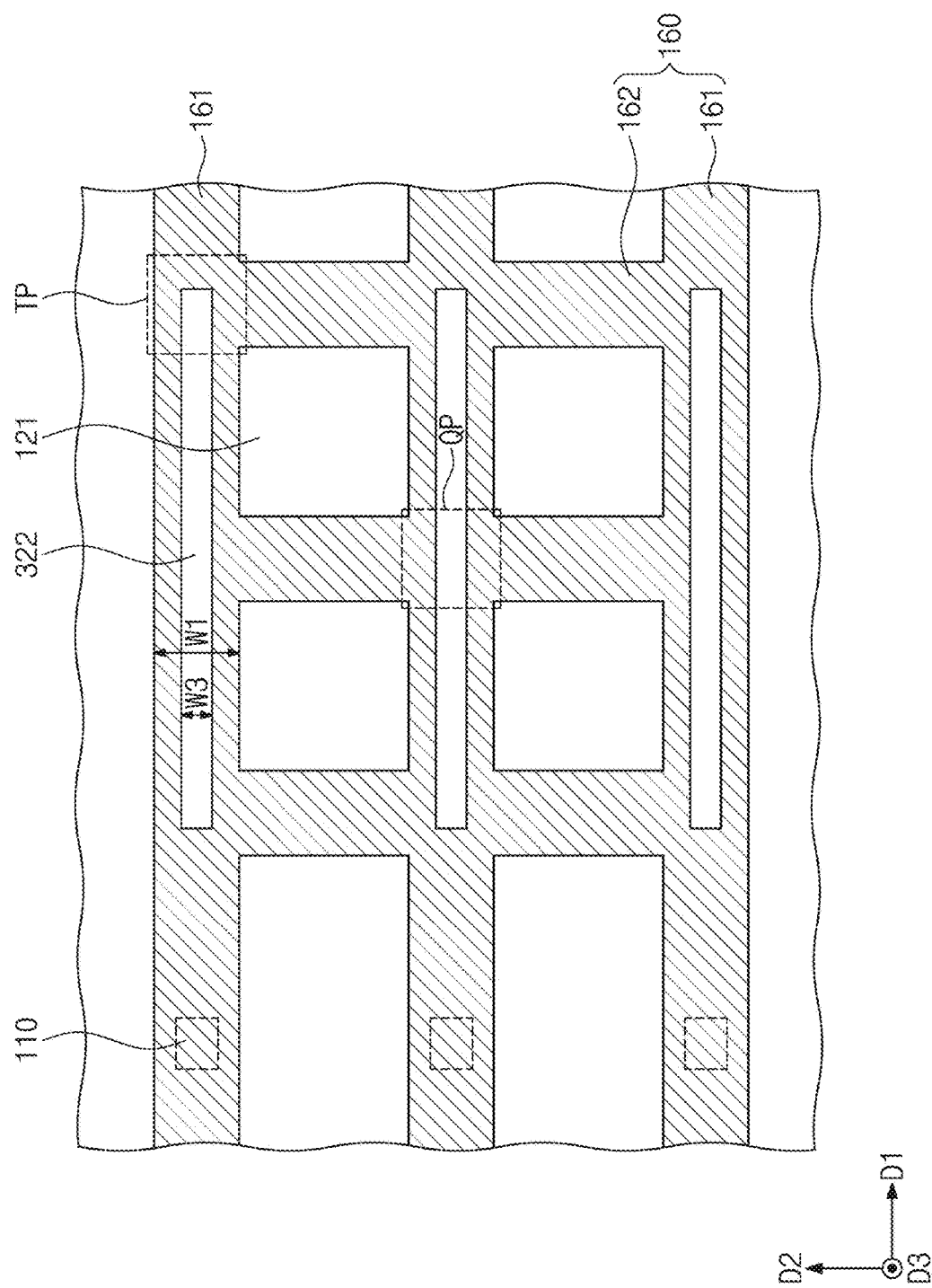

Referring to FIG. 9, second insulating patterns 322 may be disposed in the first interconnection lines 161 of the interconnection pattern 160. The second insulating patterns 322 may extend in the first direction D1. The second insulating patterns 322 may extend into the centers of the first regions QP or the centers of the second regions TP. The second insulating patterns 322 may be spaced apart from each other in the second direction D2. Although not shown in the drawings, at least one of the second insulating patterns 322 may include a plurality of sub-portions extending in the first direction D1. In such, the plurality of sub-portions extending in the first direction D1 may be spaced apart from each other in the first direction D1.

Figure 10:
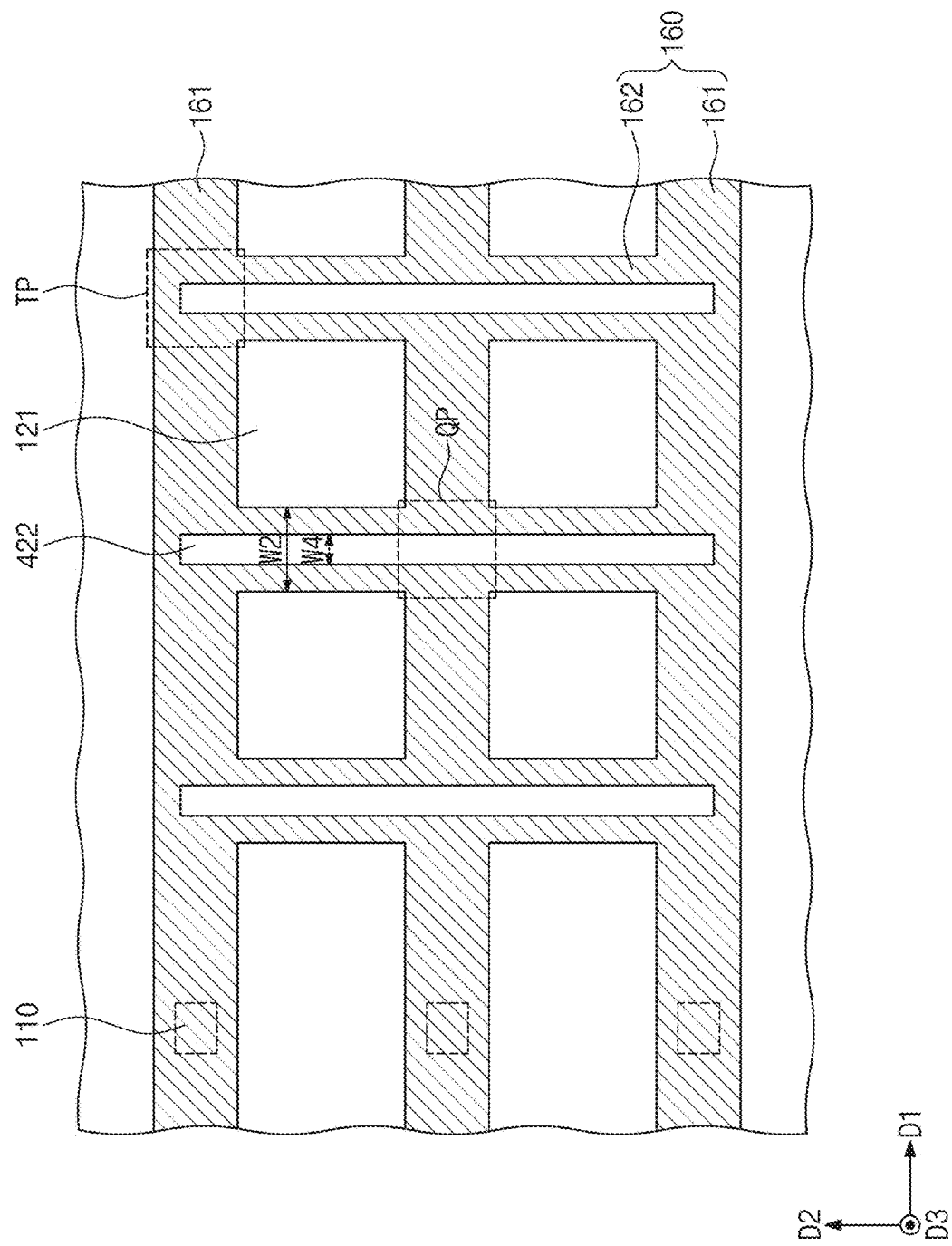

Referring to FIG. 10, second insulating patterns 422 may be disposed in portions of the first interconnection lines 161 and the second interconnection lines 162 of the interconnection pattern 160. The second insulating patterns 422 may extend in the second direction D2. Each of the second insulating patterns 422 may extend into the center of the first region QP and/or the center of the second region TP. The second insulating patterns 422 may be spaced apart from each other in the first direction D1. Although not shown in the drawings, at least one of the second insulating patterns 422 may include a plurality of sub-portions extending in the second direction D2. In such case, the plurality of sub-portions extending in the second direction D2 may be spaced apart from each other in the second direction D2.

Figure 11:
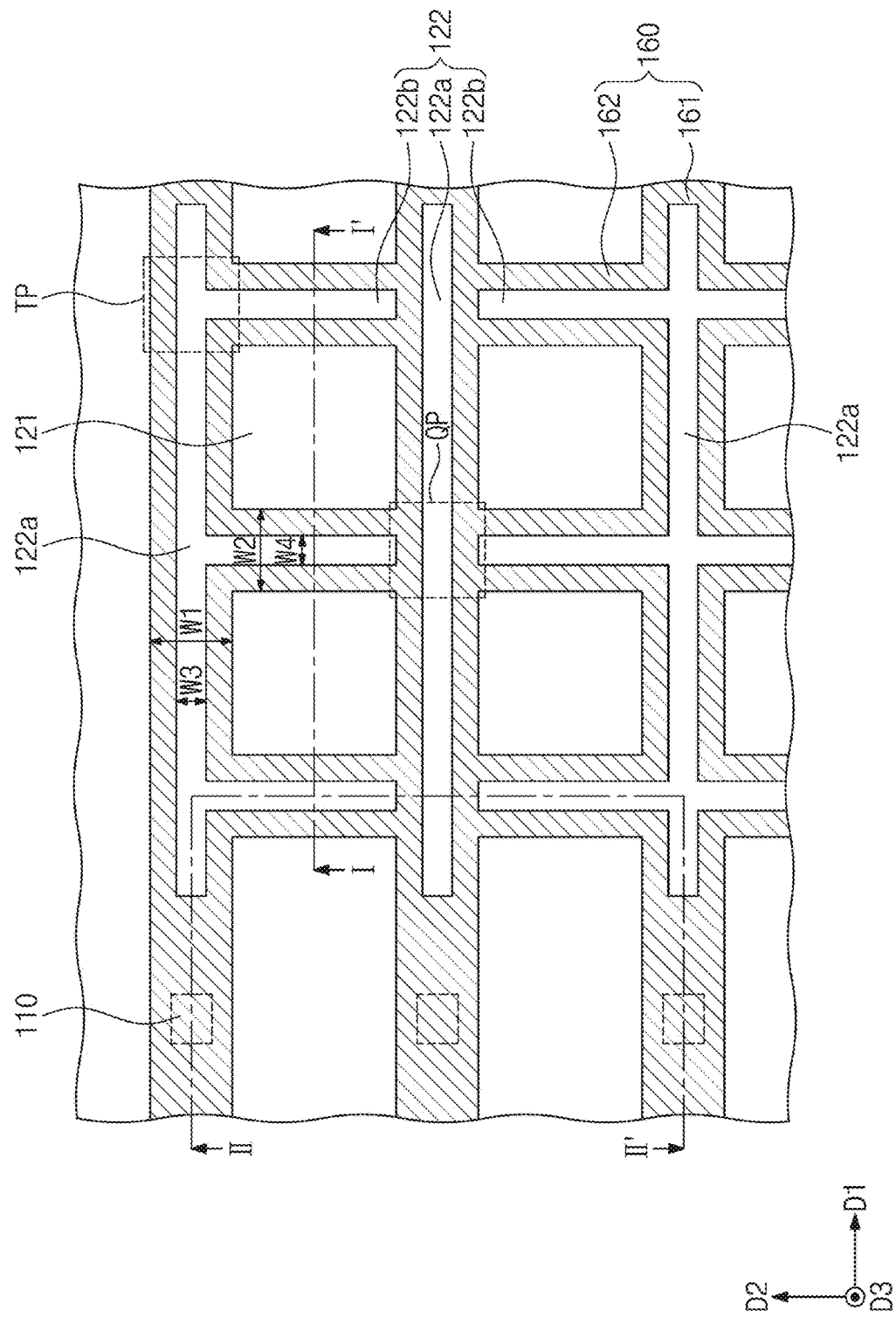

Referring to FIG. 11, first portions 122a and second portions 122b of the second insulating pattern 122 may further extend through the first regions QP and the second regions TP. One end portion of each of the first portions 122a may not be connected to the second portions 122b. The one end portion of each of the first portions 122a may not overlap one of the second interconnection lines 162 in the second direction D2. The one end portion of each of the first portions 122a may overlap the first insulating pattern 121 in the second direction D2. The one end portion of each of the first portions 122a may be spaced apart from the contact 110. Some of the second portions 122b may intersect the first portion 122a and may further extend in the second direction D2. For example, from the center of at least one of the first regions QP, the first portion 122a may extend in the first direction D1 and a direction opposite to the first direction D1 and the second portion 122b may extend in the second direction D2 and the direction opposite to the second direction D2. Meanwhile, for example, one of the first portions 122a may not be connected to the second portions 122b.

Figure 12:
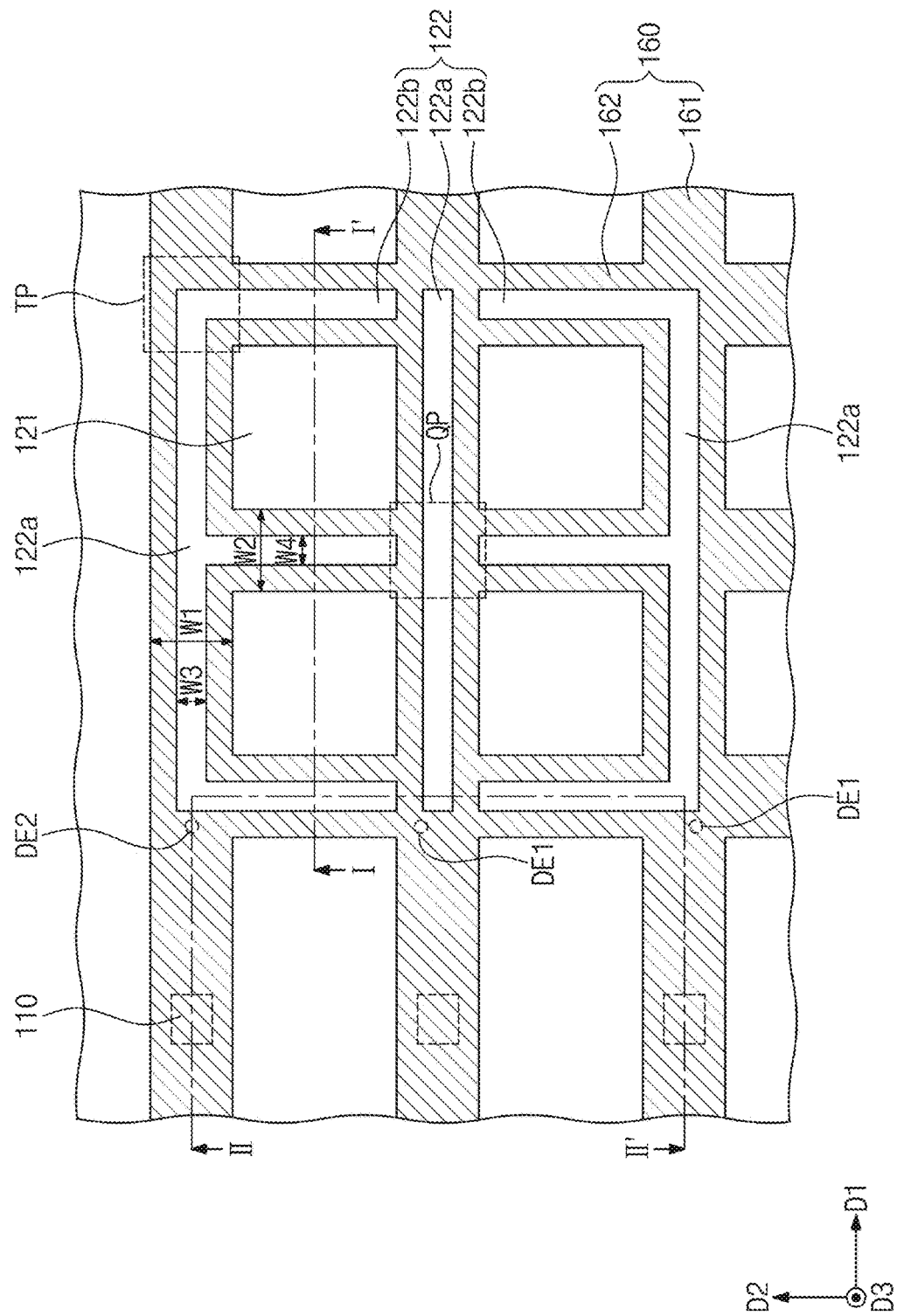

Referring to FIG. 12, a first dent region DE1 may be provided in at least one of the first regions QP. A second dent region DE2 may be provided in at least one of the second regions TP. The first and second dent regions DE1 and DE2 may be defined as regions recessed in a direction opposite to the third direction D3. Although not specifically illustrated in FIG. 12, the interconnection pattern 160 may not be formed in the first and second dent regions DE1 and DE2. For example, an insulating material may fill the first and second dent regions DE1 and DE2 in a process after manufacturing the interconnection structure. For example, the first and second dent regions DE1 and DE2 may be spaced apart from the second insulating pattern 122. In some example embodiments, unlike FIG. 12, the first and second dent regions DE1 and DE2 may be in contact with the second insulating pattern 122. Positions of the first and second dent regions DE1 and DE2 in FIG. 12 are illustrated as an example. However, example embodiments of the inventive concepts are not limited thereto. The first and second dent regions DE1 and DE2 may be provided in arbitrary ones of the first regions QP and the second regions TP.

Figure 13:
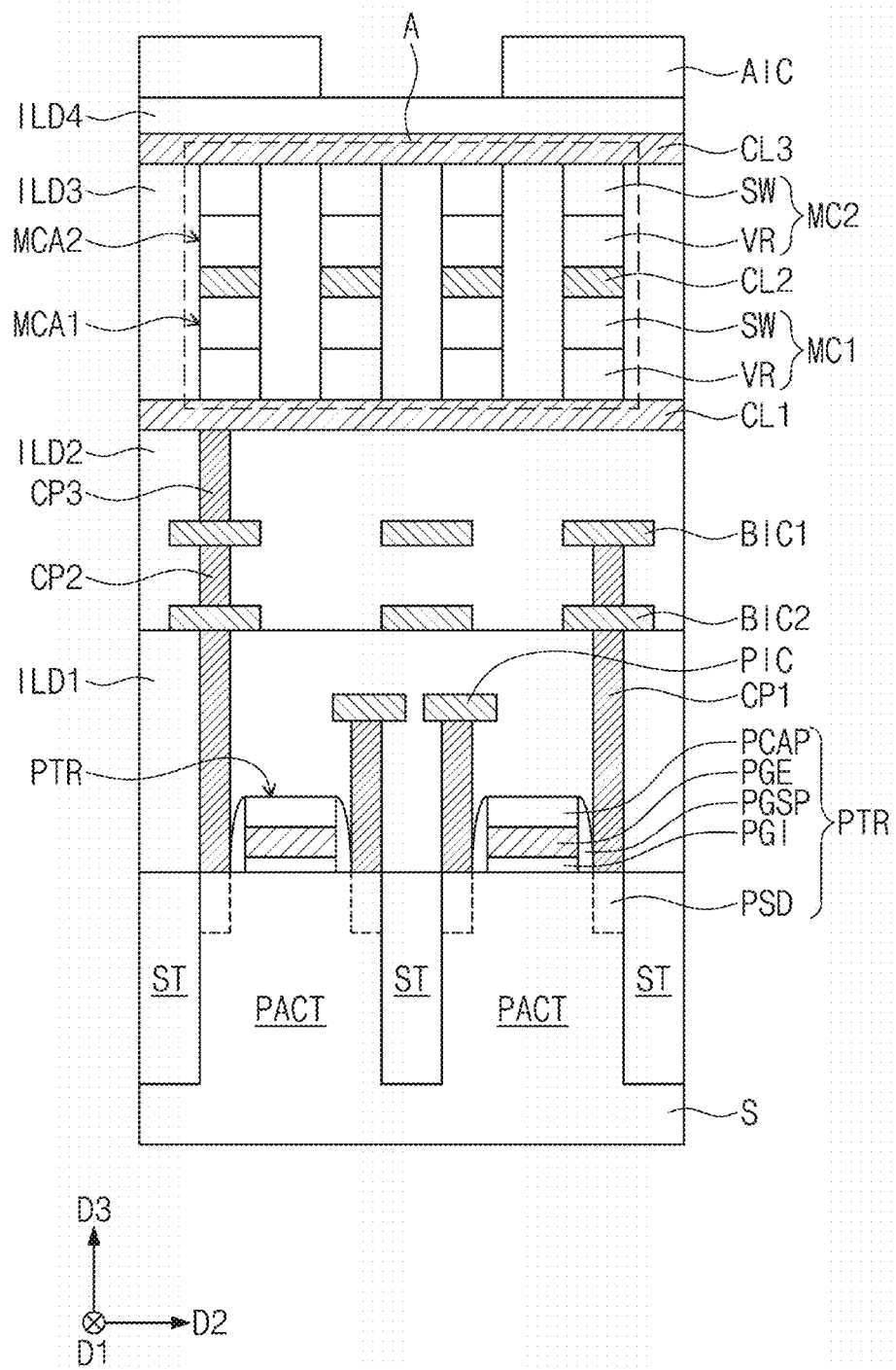
FIG. 13 is a cross-sectional view illustrating a semiconductor device according to an example embodiment of the inventive concepts.

FIG. 13 is a cross-sectional view illustrating a semiconductor device according to an example embodiment of the inventive concepts. A portion 'A' in a semiconductor device of FIG. 13 may be a memory device. For example, the portion 'A' may be a variable resistance memory device.

Referring to FIG. 13, a substrate S including a device isolation layer ST may be provided. The substrate S may be a semiconductor substrate. For example, the substrate S may be a silicon substrate, a germanium substrate, or a silicon-germanium substrate. The device isolation layer ST may define active regions PACT in the substrate S. For example, the device isolation layer ST may include at least one of a silicon oxide layer, a silicon nitride layer, or a silicon oxynitride layer.

A peripheral circuit including transistors PTR, first contacts CP1, and peripheral interconnection structures PIC may be provided on the substrate S. The transistors PTR may be provided on the active regions PACT of the substrate S. The transistor PTR may include a gate electrode PGE intersecting the active region PACT, a gate dielectric pattern PGI between the substrate S and the gate electrode PGE, a gate capping pattern PCAP on a top surface of the gate electrode PGE, gate spacers PGSP on sidewalls of the gate electrode PGE, and source/drain regions PSD in the active region PACT at both sides of the gate electrode PGE. The first contacts CP1 and the peripheral interconnection structures PIC connected to the first contacts CP1 may be electrically connected to the transistors PTR. A first interlayer insulating layer ILD1 may cover the transistors PTR. The first contacts CP1 and the peripheral interconnection structures PIC may penetrate or may be disposed in at least portions of the first interlayer insulating layer ILD1.

A second interlayer insulating layer ILD2 including first and second lower interconnection structures BIC1 and BIC2 and second and third contacts CP2 and CP3 may be provided on the first interlayer insulating layer ILD1. The first and second lower interconnection structures BIC1 and BIC2 and the second and third contacts CP2 and CP3 may electrically connect first conductive lines CL1 to the peripheral circuit on the substrate S. A third interlayer insulating layer ILD3 including the memory device 'A' may be provided on the second interlayer insulating layer ILD2. The memory device 'A' may include first to third conductive lines CL1, CL2 and CL3 and first and second memory cell stacks MCA1 and MCA2. The memory device 'A' will be described later in more detail with reference to FIG. 14. A fourth interlayer insulating layer ILD4 and additional interconnection lines AIC may further be provided on the third interlayer insulating layer ILD3 including the memory device 'A'.

Each of the first and second lower interconnection structures BIC1 and BIC2 and the peripheral interconnection structures PIC may correspond to one of the interconnection structures described with reference to FIGS. 1, 2A, 2B and 8 to 12. In other words, each of the first and second lower interconnection structures BIC1 and BIC2 and the peripheral interconnection structures PIC may include the first interconnection lines extending in the first direction D1, and the second interconnection lines extending in the second direction D2 and connecting the first interconnection lines. That is, each of the first and second lower interconnection structures BIC1 and BIC2 and the peripheral interconnection structures PIC may have the mesh shape. An electrical resistance between the peripheral circuit and the memory device 'A' of the semiconductor device may be reduced by the interconnection structures BIC1, BIC2 and PIC having the mesh shapes. Further, each of the interconnection structures BIC1, BIC2 and PIC may be formed without a seam or a void, and thus electrical characteristics of the semiconductor device may be improved.

Figure 14:
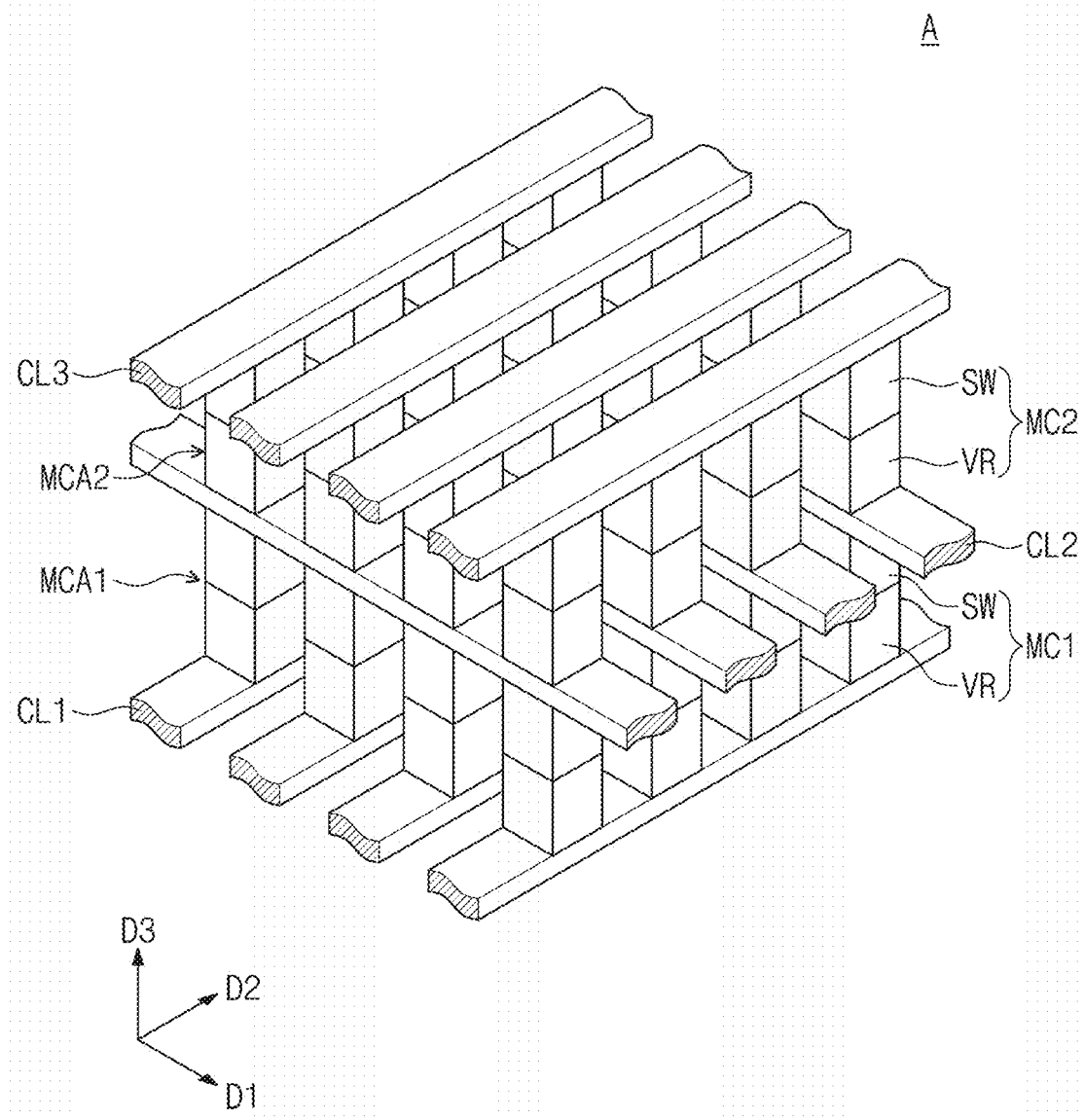
FIG. 14 is an enlarged view of a portion 'A' of FIG. 13 to illustrate a portion of a semiconductor device according to an example embodiment of the inventive concepts.

FIG. 14 is an enlarged view of a portion 'A' of FIG. 13 to illustrate a portion of a semiconductor device according to an example embodiment of the inventive concepts. Two memory cell stacks adjacent to each other in the third direction D3 are illustrated as an example in FIG. 14. However, example embodiments of the inventive concepts are not limited thereto.

Referring to FIG. 14, the first conductive lines CL1, the second conductive lines CL2 and the third conductive lines CL3 may be provided. The first conductive lines CL1 may extend in the second direction D2, the second conductive lines CL2 may extend in the first direction D1 intersecting the second direction D2, and the third conductive lines CL3 may extend in the second direction D2. The first to third conductive lines CL1, CL2 and CL3 may be sequentially provided in the third direction D3 perpendicular to the first direction D1 and the second direction D2. The first to third conductive lines CL1, CL2 and CL3 may include a metal (e.g., copper, tungsten, or aluminum) and/or a metal nitride (e.g., tantalum nitride, titanium nitride, or tungsten nitride).

The first memory cell stack MCA1 may be provided between the first conductive lines CL1 and the second conductive lines CL2, and the second memory cell stack MCA2 may be provided between the second conductive lines CL2 and the third conductive lines CL3. The first memory cell stack MCA1 may include first memory cells MC1 that are provided at intersection points of the first conductive lines CL1 and the second conductive lines CL2, respectively. The first memory cells MC1 may be two-dimensionally arranged to constitute rows and columns. The second memory cell stack MCA2 may include second memory cells MC2 that are provided at intersection points of the second conductive lines CL2 and the third conductive lines CL3, respectively. The second memory cells MC2 may be two-dimensionally arranged to constitute rows and columns.

Each of the first and second memory cells MC1 and MC2 may include a variable resistance element VR and a selection element SW. The variable resistance element VR and the selection element SW may be connected in series between a pair of conductive lines CL1 and CL2 (or CL2 and CL3) connected thereto. For example, the variable resistance element VR and the selection element SW included in each of the first memory cells MC1 may be connected in series between a corresponding one of the first conductive lines CL1 and a corresponding one of the second conductive lines CL2, and the variable resistance element VR and the selection element SW included in each of the second memory cells MC2 may be connected in series between a corresponding one of the second conductive lines CL2 or a corresponding one of the third conductive lines CL3.

The variable resistance element VR may include a material capable of storing information (or data) using its resistance change. For example, the variable resistance element VR may include a material of which a phase is reversibly changeable between a crystalline state and an amorphous state by a temperature. For example, the variable resistance element VR may include a compound that includes at least one of Te or Se (which are chalcogen elements) and at least one of Ge, Sb, Bi, Pb, Sn, Ag, As, S, Si, In, Ti, Ga, P, O, or C. For example, the selection element SW may include a silicon diode or oxide diode which has a rectifying property.

In FIG. 13, the selection element SW is provided on the variable resistance element VR. However, example embodiments of the inventive concepts are not limited thereto. In certain example embodiments, the variable resistance element VR may be provided on the selection element SW, unlike FIG. 13.

The semiconductor device according to the above example embodiments of the inventive concepts may minimize an electrical resistance by the interconnection pattern having the mesh shape and may mitigate or prevent occurrence of a seam and/or a void by the insulating pattern disposed in the interconnection pattern. Thus, the electrical characteristics of the semiconductor device may be improved.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a lower layer;
a plurality of first interconnection lines extending in a first direction on the lower layer;
a plurality of second interconnection lines extending in a second direction between the first interconnection lines, and connecting the first interconnection lines, the second direction intersecting the first direction;
first insulating patterns between the second interconnection lines; and
second insulating patterns disposed in the first interconnection lines,
wherein the first interconnection lines include connection regions, to each of which at least one of the second interconnection lines is connected, and
wherein the second insulating patterns extend into the connection regions.

2. The semiconductor device of claim 1, wherein
the second insulating patterns comprise first portions disposed in the first interconnection lines and second portions disposed in the second interconnection lines,
the first portions extend in the first direction,
the second portions extend in the second direction, and
each of the second portions is connected to at least one of the first portions adjacent thereto.

3. The semiconductor device of claim 2, wherein
a first width of each of the first portions in the second direction is less than a first maximum width of each of the first interconnection lines in the second direction, and
a second width of each of the second portions in the first direction is less than a second maximum width of each of the second interconnection lines in the first direction.

4. The semiconductor device of claim 3, wherein the first maximum width of each of the first interconnection lines in the second direction is equal to the second maximum width of each of the second interconnection lines in the first direction.

5. The semiconductor device of claim 2, wherein a length, which extends in the second direction, of each of the second portions is greater than a distance between the first interconnection lines adjacent to each other in the second direction.

6. The semiconductor device of claim 2, wherein
at least one of the first portions comprises a plurality of sub-portions extending in the first direction, and
the sub-portions are spaced apart from each other in the first direction.

7. The semiconductor device of claim 2, wherein
one end portion of one of the second portions is connected to one of the first portions adjacent to the one of the second portions, and
another end portion, which is opposite to the one end portion, of the one of the second portions is spaced apart from another adjacent one of the first portions in the second direction.

8. The semiconductor device of claim 7, wherein the one end portion is connected to the another adjacent one of the first portions at one of the connection regions.

9. The semiconductor device of claim 1, wherein the first insulating patterns and the second insulating patterns include the same material.

10. The semiconductor device of claim 1, wherein a width of each of the first and second interconnection lines increases as a height from the lower layer increases.

11. A semiconductor device comprising:
a lower layer;
a plurality of first interconnection lines extending in a first direction on the lower layer;
a plurality of second interconnection lines extending in a second direction between the first interconnection lines and connecting the first interconnection lines, the second direction intersecting the first direction;
first insulating patterns between the second interconnection lines; and second insulating patterns including first portions disposed in the first interconnection lines,
wherein first widths of the second insulating patterns in the second direction are less than second widths of the first insulating patterns in the second direction.

12. The semiconductor device of claim 11, wherein
the second insulating patterns further comprise second portions disposed in the second interconnection lines,
the first portions extend in the first direction,
the second portions extend in the second direction, and
each of the second portions is connected to at least one of the first portions adjacent thereto.

13. The semiconductor device of claim 12, wherein
the first interconnection lines include connection regions, to each of which at least one of the second interconnection lines is connected, and
each of the second portions is connected to at least one of the first portions adjacent thereto at a corresponding one of the connection regions.

14. The semiconductor device of claim 13, wherein the first portions and the second portions extend into centers of the connection regions.

15. The semiconductor device of claim 12, wherein
the first portions are spaced apart from the first insulating patterns in the second direction, and
the second portions are spaced apart from the first insulating patterns in the first direction.

16. The semiconductor device of claim 11, wherein first top surfaces of the first and second interconnection lines, second top surfaces of the first insulating patterns, and third top surfaces of the second insulating patterns are coplanar with each other.

17. A semiconductor device comprising:
a substrate including a plurality of active regions;
at least one interconnection structure on the substrate;
a peripheral circuit between the interconnection structure and the substrate and connected to the interconnection structure through a first contact; and
a memory device on the interconnection structure and connected to the interconnection structure through a second contact,
wherein the peripheral circuit comprises transistors on the substrate,
wherein the memory device comprises a plurality of conductive lines and a variable resistance element between the conductive lines, and
wherein the interconnection structure comprises,
a lower layer,
a plurality of first interconnection lines extending in a first direction,
a plurality of second interconnection lines extending in a second direction between the first interconnection lines and connecting the first interconnection lines the second direction intersecting the first direction,
first insulating patterns between the second interconnection lines,
second insulating patterns disposed in the first interconnection lines and the second interconnection lines, and
a barrier pattern covering bottom surfaces and sidewalls of the first and second interconnection lines,
wherein the first interconnection lines include connection regions, to each of which at least one of the second interconnection lines is connected, and
wherein the second insulating patterns extend into the connection regions.

18. The semiconductor device of claim 17, wherein
the second insulating patterns comprise first portions disposed in the first interconnection lines and second portions disposed in the second interconnection lines, and
each of the second portions is connected to at least one of the first portions adjacent thereto.

19. The semiconductor device of claim 18, wherein a length, which extends in the second direction, of each of the second portions is greater than a distance between the first interconnection lines adjacent to each other in the second direction.

20. The semiconductor device of claim 19, wherein
at least one of the first portions comprises a plurality of sub-portions extending in the first direction, and
the sub-portions are spaced apart from each other in the first direction.

* * * * *